US012765107B2

(12) United States Patent
Cheng et al.

(10) Patent No.: US 12,765,107 B2
(45) Date of Patent: Oct. 13, 2026

(54) CHIP PACKAGE AND MANUFACTURING METHOD THEREOF

(71) Applicant: Xintec Inc., Taoyuan City (TW)

(72) Inventors: Chia-Ming Cheng, New Taipei City (TW); Shu-Ming Chang, New Taipei City (TW)

(73) Assignee: XINTEC INC., Taoyuan City (TW)

( * ) Notice: Subject to any disclaimer, the term of this patent is extended or adjusted under 35 U.S.C. 154(b) by 520 days.

(21) Appl. No.: 18/307,004

(22) Filed: Apr. 26, 2023

(65) Prior Publication Data

US 2023/0369528 A1 Nov. 16, 2023

Related U.S. Application Data

(60) Provisional application No. 63/342,089, filed on May 14, 2022.

(51) Int. Cl.

| | |
|---|---|
| ***H10F 55/00*** | (2025.01) |
| ***H10F 55/20*** | (2025.01) |
| ***H10F 71/00*** | (2025.01) |
| ***H10F 77/00*** | (2025.01) |
| ***H10F 77/30*** | (2025.01) |
| ***H10F 77/40*** | (2025.01) |

(52) U.S. Cl.

CPC ............. *H10F 55/18* (2025.01); *H10F 55/20* (2025.01); *H10F 71/137* (2025.01); *H10F 77/30* (2025.01); *H10F 77/413* (2025.01); *H10F 77/93* (2025.01)

(58) Field of Classification Search

CPC ........ H10F 55/18; H10F 55/20; H10F 71/137; H10F 77/30; H10F 77/413; H10F 77/93; H10F 77/407; H10F 77/50; H01L 25/167; H01L 21/50; H01L 23/3107

USPC .......................................................... 257/738

See application file for complete search history.

(56) References Cited

U.S. PATENT DOCUMENTS

2013/0153933 A1* 6/2013 Lee ......................... H10F 55/00 257/82
2015/0109785 A1* 4/2015 Kerness .................... G01J 1/08 362/253
2016/0284920 A1* 9/2016 Saugier ................... H10F 77/50
2017/0052277 A1* 2/2017 Wong ....................... G01V 8/12
2017/0123064 A1* 5/2017 Luan ..................... G01J 1/0204

(Continued)

FOREIGN PATENT DOCUMENTS

TW 554619 B 9/2003
TW 200527718 A 8/2005

(Continued)

*Primary Examiner* — Mohammad M Hoque
(74) *Attorney, Agent, or Firm* — LIU & LIU

(57) ABSTRACT

A chip package includes a chip, a first support layer, a light emitter, a first light transmissive sheet, a redistribution layer, and a conductive structure. A top surface of the chip has a conductive pad and a first light receiver. The first support layer is located on the top surface of the chip. The light emitter is located on the top surface of the chip. The first light transmissive sheet is located on the first support layer and covers the first light receiver. The redistribution layer is electrically connected to the conductive pad and extends to a bottom surface of the chip. The conductive structure is located on the redistribution layer that is on the bottom surface of the chip.

20 Claims, 20 Drawing Sheets

100f

(56) References Cited

U.S. PATENT DOCUMENTS

| | | | | |
|---|---|---|---|---|
| 2019/0081196 | A1 | 3/2019 | Ho et al. | |
| 2020/0107436 | A1* | 4/2020 | He | H01L 23/3121 |

FOREIGN PATENT DOCUMENTS

| | | | |
|---|---|---|---|
| TW | 201939758 | A | 10/2019 |
| TW | 202041903 | A | 11/2020 |

* cited by examiner

CHIP PACKAGE AND MANUFACTURING METHOD THEREOF

CROSS-REFERENCE TO RELATED APPLICATIONS

This application claims priority to U.S. Provisional Application Ser. No. 63/342,089, filed May 14, 2022 which is herein incorporated by reference.

BACKGROUND

Field of Invention

The present disclosure relates to a chip package and a manufacturing method of the chip package.

Description of Related Art

Generally, a light emitter and a chip package that has a light receiver may be disposed on a printed circuit board. The light emitter can emit light. When the light meets an object, it can be reflected to the light receiver of the chip package, and the position information (such as distance) of the object can be obtained through calculation. Chip packages having light receivers have been widely used in the automotive industry.

However, the light emitter and the chip package that has the light receiver cannot be packaged together during manufacture, and a large space must be reserved on the printed circuit board, which is an inconvenient factor for miniaturization design, and it is difficult to reduce assembly cost.

SUMMARY

One aspect of the present disclosure provides a chip package.

According to some embodiments of the present disclosure, a chip package includes a chip, a first support layer, a light emitter, a first light transmissive sheet, a redistribution layer, and a conductive structure. A top surface of the chip has a conductive pad and a first light receiver. The first support layer is located on the top surface of the chip. The light emitter is located on the top surface of the chip. The first light transmissive sheet is located on the first support layer and covers the first light receiver. The redistribution layer is electrically connected to the conductive pad and extends to a bottom surface of the chip. The conductive structure is located on the redistribution layer that is on the bottom surface of the chip.

In some embodiments, a material of the first support layer includes epoxy, and the first support layer surrounds the first light receiver.

In some embodiments, the first support layer is an adhesive, and the first support layer overlaps the first light receiver in a vertical direction.

In some embodiments, the chip package further includes an anti-reflection layer located on a bottom surface of the first light transmissive sheet.

In some embodiments, the anti-reflection layer extends to a sidewall of the first light transmissive sheet proximal to the light emitter.

In some embodiments, the top surface of the chip further has a second light receiver, and the light emitter is located between the first light receiver and the second light receiver.

In some embodiments, the chip package further includes a second support layer and a second light transmissive sheet. The second support layer is located on the top surface of the chip. The second light transmissive sheet is located on the second support layer and covers the second light receiver.

In some embodiments, the chip package further includes an anti-reflection layer located on a bottom surface of the second light transmissive sheet.

In some embodiments, the anti-reflection layer extends to a sidewall of the second light transmissive sheet proximal to the light emitter.

In some embodiments, a material of the second support layer includes epoxy, and the second support layer surrounds the second light receiver.

In some embodiments, the second support layer is an adhesive, and the second support layer overlaps the second light receiver in a vertical direction.

In some embodiments, the chip package further includes a transparent glue covering the light emitter.

In some embodiments, the chip has an inclined surface adjoining the top surface and the bottom surface, the conductive pad protrudes from the inclined surface, and an outer sidewall of the conductive pad is in contact with the redistribution layer.

In some embodiments, the chip package further includes an isolation layer and an insulating layer. The isolation layer is disposed along the inclined surface and the bottom surface of the chip, and is located between the chip and the redistribution layer. The insulating layer covers a bottom surface of the redistribution layer and a bottom surface of the isolation layer, wherein the conductive structure protrudes from the insulating layer.

In some embodiments, the chip has a through hole, the conductive pad is located in the through hole, and the redistribution layer extends into the through hole to be in contact with the conductive pad, and the chip package further includes an isolation layer. The isolation layer is located between the bottom surface of the chip and the redistribution layer and between a sidewall of the through hole and the redistribution layer.

In some embodiments, the chip package further includes an insulating layer. The insulating layer is located on a bottom surface of the redistribution layer and the bottom surface of the chip, and covers an opening of the through hole, wherein the conductive structure protrudes from the insulating layer.

Another aspect of the present disclosure provides a manufacturing method of a chip package.

According to some embodiments of the present disclosure, a manufacturing method of a chip package includes bonding a mother light transmissive sheet to a first support layer on a top surface of a wafer, wherein the top surface of the wafer has a conductive pad and a first light receiver, the mother light transmissive sheet covers the first light receiver and has a trench; etching a bottom surface of the wafer to form a recess or a through hole that exposes the conductive pad; forming a redistribution layer electrically connected to the conductive pad and extending to the bottom surface of the wafer; forming a conductive structure on the redistribution layer on the bottom surface of the wafer; grinding a top surface of the mother light transmissive sheet to form a first light transmissive sheet at one side of the trench; cutting the first light transmissive sheet, the first support layer, and the wafer such that the wafer forms a chip; and disposing a light emitter on a top surface of the chip.

In some embodiments, the top surface of the wafer further has a second light receiver, bonding the mother light transmissive sheet to the first support layer on the top surface of the wafer is performed such that the mother light transmissive sheet is simultaneously bonded to a second support layer on the top surface of the wafer, and the mother light transmissive sheet covers the second support layer.

In some embodiments, the manufacturing method of the chip package further includes forming an anti-reflection layer on a bottom surface of the mother light transmissive sheet.

In some embodiments, the manufacturing method of the chip package further includes forming the anti-reflection layer on a sidewall of the trench of the mother light transmissive sheet.

In the aforementioned embodiments of the present disclosure, since the chip package includes the light emitter and the first light receiver of the chip, the chip package has multiple functions for emitting light and receiving light. The light emitter and the first light receiver are both located on the top surface of the chip. In operation, the light emitter can emit light. When the light meets an object, it can be reflected to the first light receiver of the chip package, and the position information (such as distance) of the object can be obtained through calculating and comparing reference data. The first light receiver may transfer data to the bottom side of the chip by the configuration of the conductive pad, the redistribution layer, and the conductive structure, thereby electrically connecting external electronic device (e.g., a printed circuit board). The chip package has multiple functions for emitting light and receiving light, which facilitates miniaturization design and can electively reduce assembly cost. Moreover, the manufacturing method of the chip package can use wafer level package to package the light emitter and the first light receiver together in the chip package, thereby improving the yield and production efficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
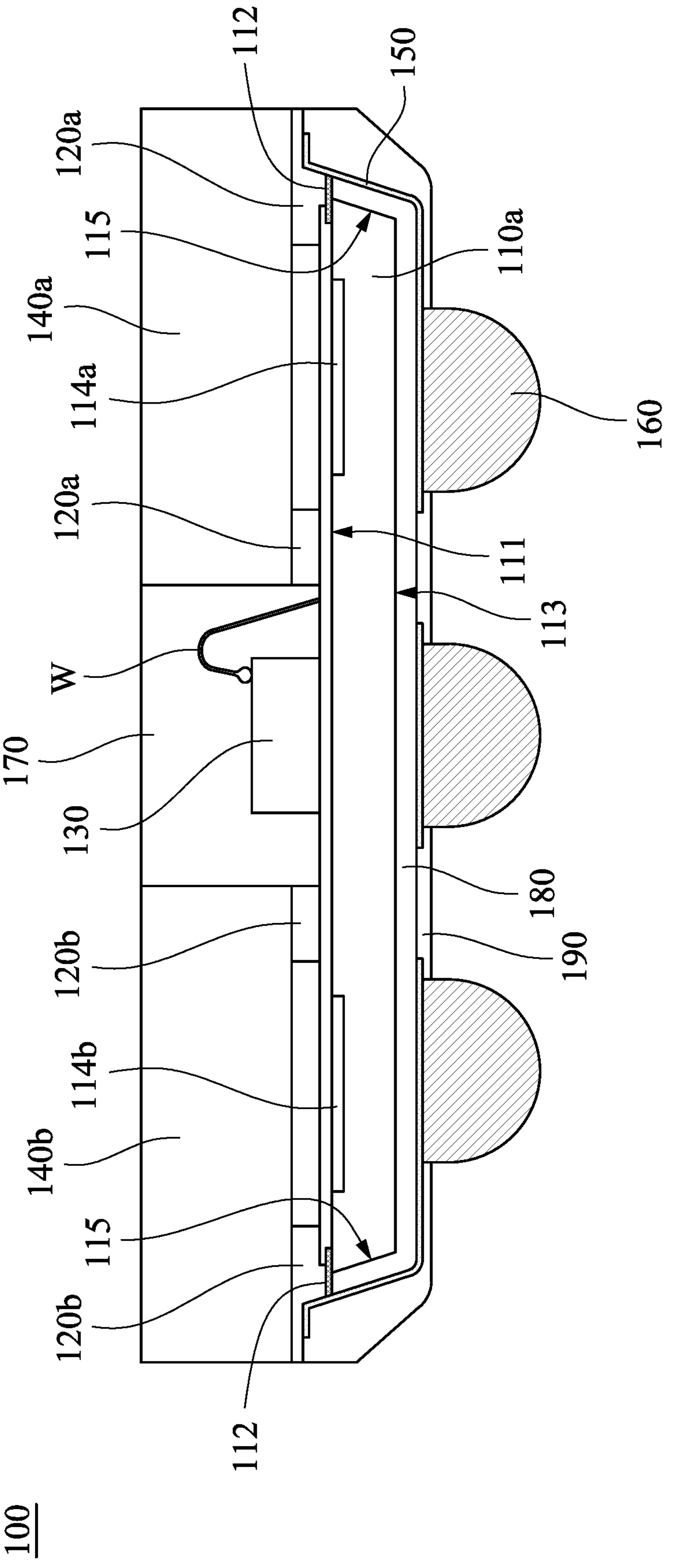
FIG. 1 is a cross-sectional view of a chip package according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of a chip package 100 according to one embodiment of the present disclosure. As shown in FIG. 1, the chip package 100 includes a chip 110*a*, a first support layer 120*a*, a light emitter 130, a first light transmissive sheet 140*a*, a redistribution layer 150, and a conductive structure 160. A top surface 111 of the chip 110*a* has a conductive pad 112 and a first light receiver 114*a*. The first support layer 120*a* is located on the top surface 111 of the chip 110*a*. In this embodiment, the first support layer 120*a* surrounds the first light receiver 114*a*. The light emitter 130 is located on the top surface 111 of the chip 110*a*. The light emitter 130 may be a light emitting diode (LED). The first light transmissive sheet 140*a* is located on the first support layer 120*a* and covers the first light receiver 114*a*. The redistribution layer 150 is electrically connected to the conductive pad 112 of the chip 110*a* and extends to a bottom surface 113 of the chip 110*a*. The conductive structure 160 is located on the redistribution layer 150 that is on the bottom surface 113 of the chip 110*a*.

Specifically, since the chip package 100 includes the light emitter 130 and the first light receiver 114*a* of the chip 110*a*, the chip package 100 has multiple functions for emitting light and receiving light. The light emitter 130 and the first light receiver 114*a* are both located on the top surface 111 of the chip 110*a*. In operation, the light emitter 130 can emit light. When the light meets an object, it can be reflected to the first light receiver 114*a* of the chip package 100, and the position information (such as distance) of the object can be obtained through calculating and comparing reference data. The first light receiver 114*a* may transfer data to the bottom side of the chip 110*a* by the configuration of the conductive pad 112, the redistribution layer 150, and the conductive structure 160, thereby electrically connecting external electronic device (e.g., a printed circuit board). The chip package 100 has multiple functions for emitting light and receiving light, which facilitates miniaturization design and can electively reduce assembly cost.

In this embodiment, the top surface 111 of the chip 110*a* further includes a second light receiver 114*b*, a second support layer 120*b*, and a second light transmissive sheet 140*b*. The light emitter 130 is located between the first light receiver 114*a* and the second light receiver 114*b*. The second support layer 120*b* is located on the top surface 111 of the chip 110*a* and surrounds the second light receiver 114*b*. The second light transmissive sheet 140*b* is located on the second support layer 120*b* and covers the second light receiver 114*b*. The first light receiver 114*a* may be a main receiver, and the second light receiver 114*b* may be an auxiliary receiver. For example, when calculating and comparing data, the first light receiver 114*a* may provide actual data and the second light receiver 114*b* may provide reference data.

In this embodiment, the material of the first light transmissive sheet 140*a* and the material of the second light transmissive sheet 140*b* may be glass. The material of the first support layer 120*a* and the material of the second support layer 120*b* may include epoxy, and the first support layer 120*a* and the second support layer 120*b* are separated from each other. Furthermore, the chip package 100 may include transparent glue 170 that covers the light emitter 130. The light emitter 130 may be electrically connected to the chip 110*a* by a bonding wire W. In another embodiment, the light emitter 130 may be a surface mount device (SMD) without the bonding wire W.

In this embodiment, the chip 110*a* has an inclined surface 115 adjoining the top surface 111 and the bottom surface 113, the conductive pad 112 protrudes from the inclined surface 115, and the outer sidewall of the conductive pad 112 is in contact with the redistribution layer 150. The chip package 110 further includes an isolation layer 180 and an insulating layer 190. The isolation layer 180 is disposed along the inclined surface 115 and the bottom surface 113 of the chip 110*a*, and is located between the chip 110*a* and the redistribution layer 150. The insulating layer 190 covers the bottom surface of the redistribution layer 150 and the bottom surface of the isolation layer 180. The conductive structure 160 protrudes from the insulating layer 190.

It is to be noted that the connection relationships, the materials, and the advantages of the elements described above will not be repeated in the following description. In the following description, the manufacturing method of the chip package 100 will be explained. The manufacturing method of the chip package 100 can use wafer level package to package the light emitter 130, the first light receiver 114*a*, and the second light receiver 114*b* together in the chip package 100, thereby improving the yield and production efficiency.

Figure 2:
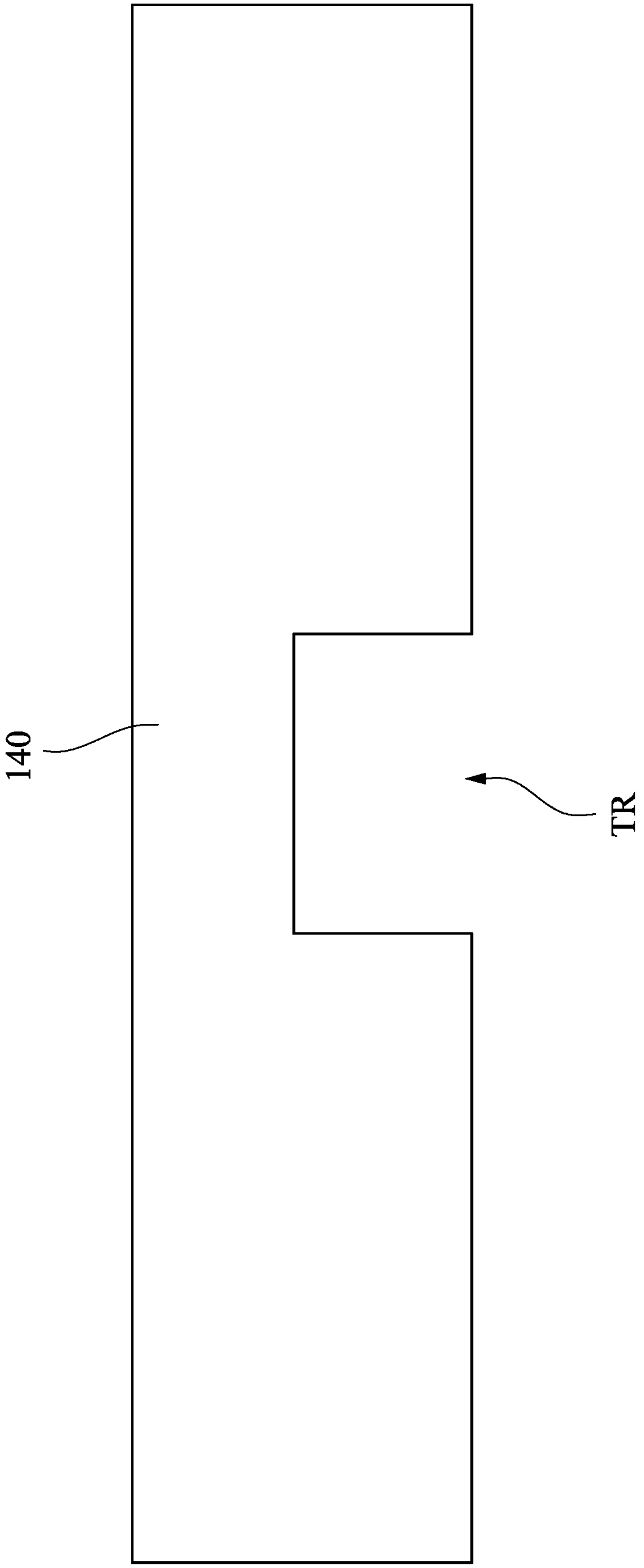
FIGS. 2 to 8 are cross-sectional views at intermediate stages of a manufacturing method of the chip package of FIG. 1.
Figure 3:
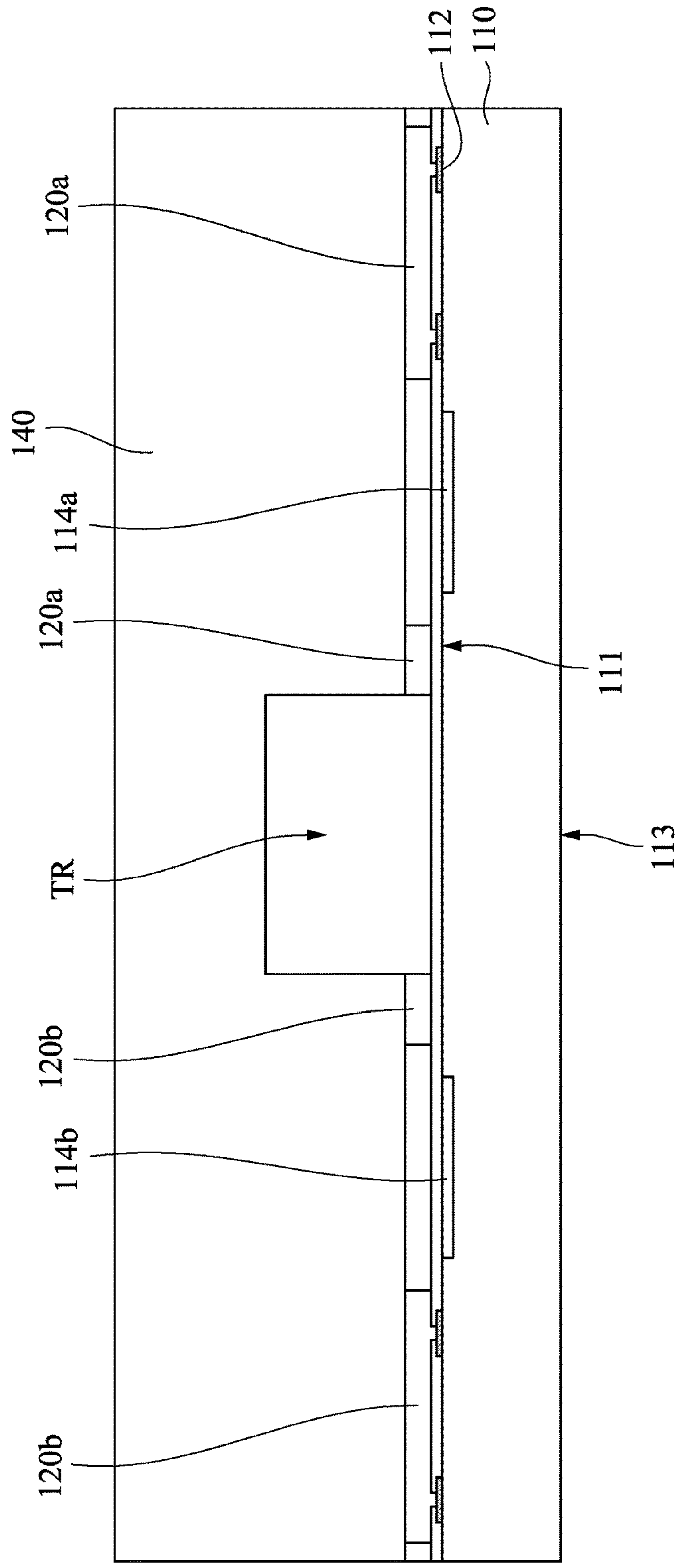

FIGS. 2 to 8 are cross-sectional views at intermediate stages of a manufacturing method of the chip package 100 of FIG. 1. As shown in FIG. 2 and FIG. 3, the manufacturing method of the chip package 100 includes bonding a mother light transmissive sheet 140 to the first support layer 120*a* on the top surface 111 of a wafer 110, wherein the top surface 111 of the wafer 110 has the conductive pad 112 and the first light receiver 114*a*. The mother light transmissive sheet 140 covers the first light receiver 114*a* and has a trench TR. The wafer 110 is a semiconductor structure that is not cut (i.e., diced) yet to form the chip 110*a* of FIG. 1. The mother light transmissive sheet 140 is a light transmissive structure that is not ground yet or not cut yet to form the first light transmissive sheet 140*a* and the second light transmissive sheet 140*b* of FIG. 1. In this embodiment, the top surface 111 of the wafer 110 further has the second light receiver 114*b*. When the mother light transmissive sheet 140 is bonded to the first support layer 120*a* on the top surface 111 of the wafer 110, the mother light transmissive sheet 140 can be simultaneously bonded to the second support layer 120*b* on the top surface 111 of the wafer 110, and the mother light transmissive sheet 140 covers the second support layer 114*b*.

Figure 4:
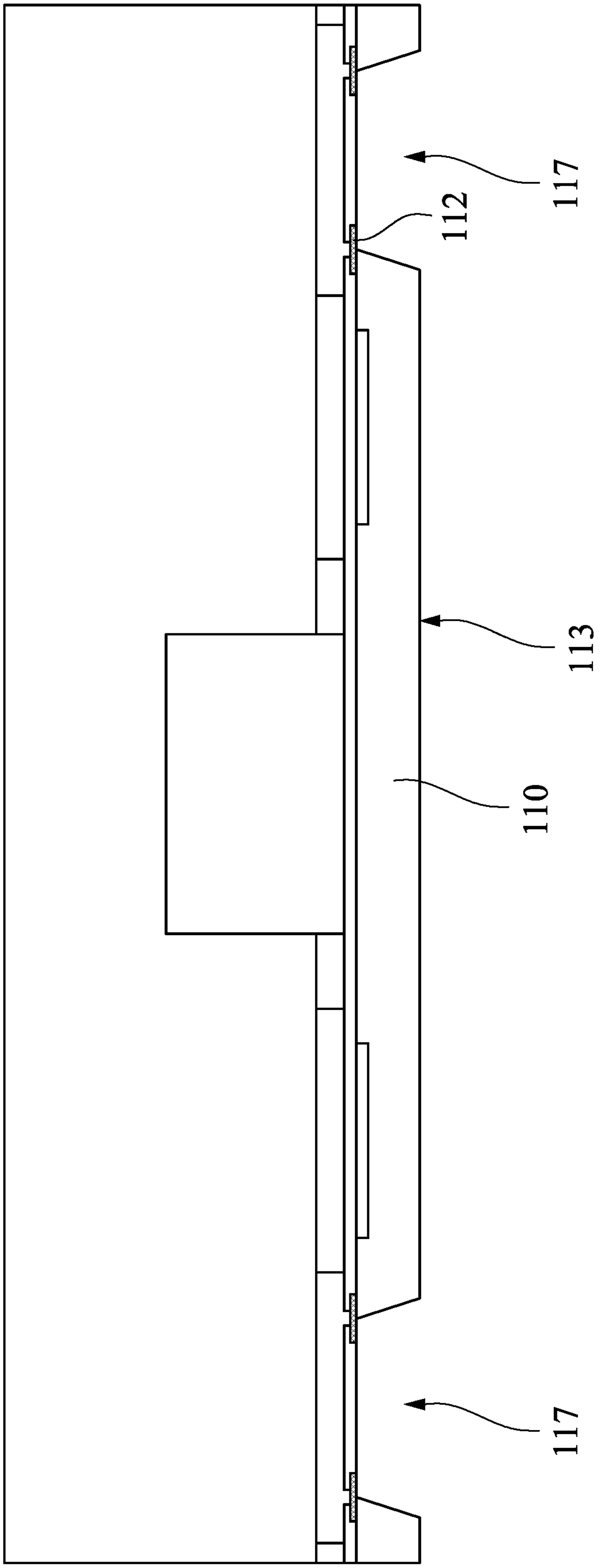

Referring to FIG. 4, thereafter, the bottom surface 113 of the wafer 110 may be ground to thin the wafer 110, and the bottom surface 113 of the wafer 110 is etched to form a recess 117 that exposes the conductive pad 112.

Figure 5:
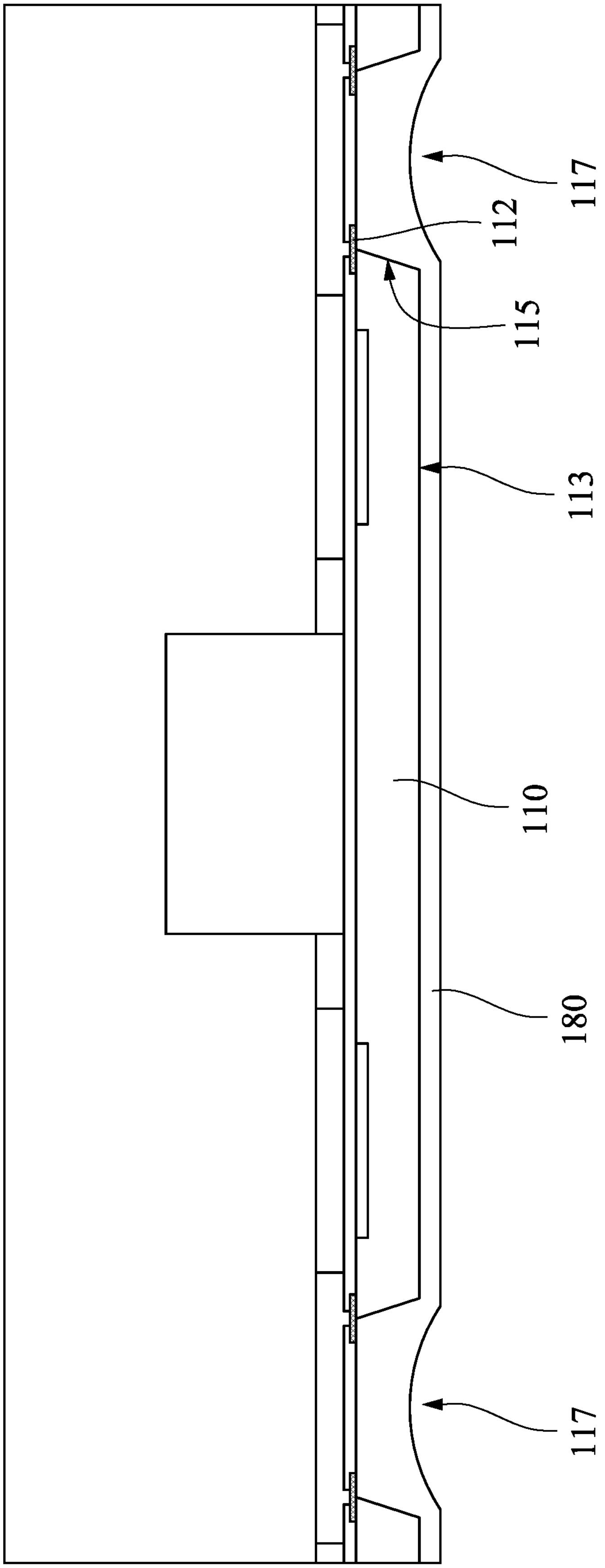
Figure 6:
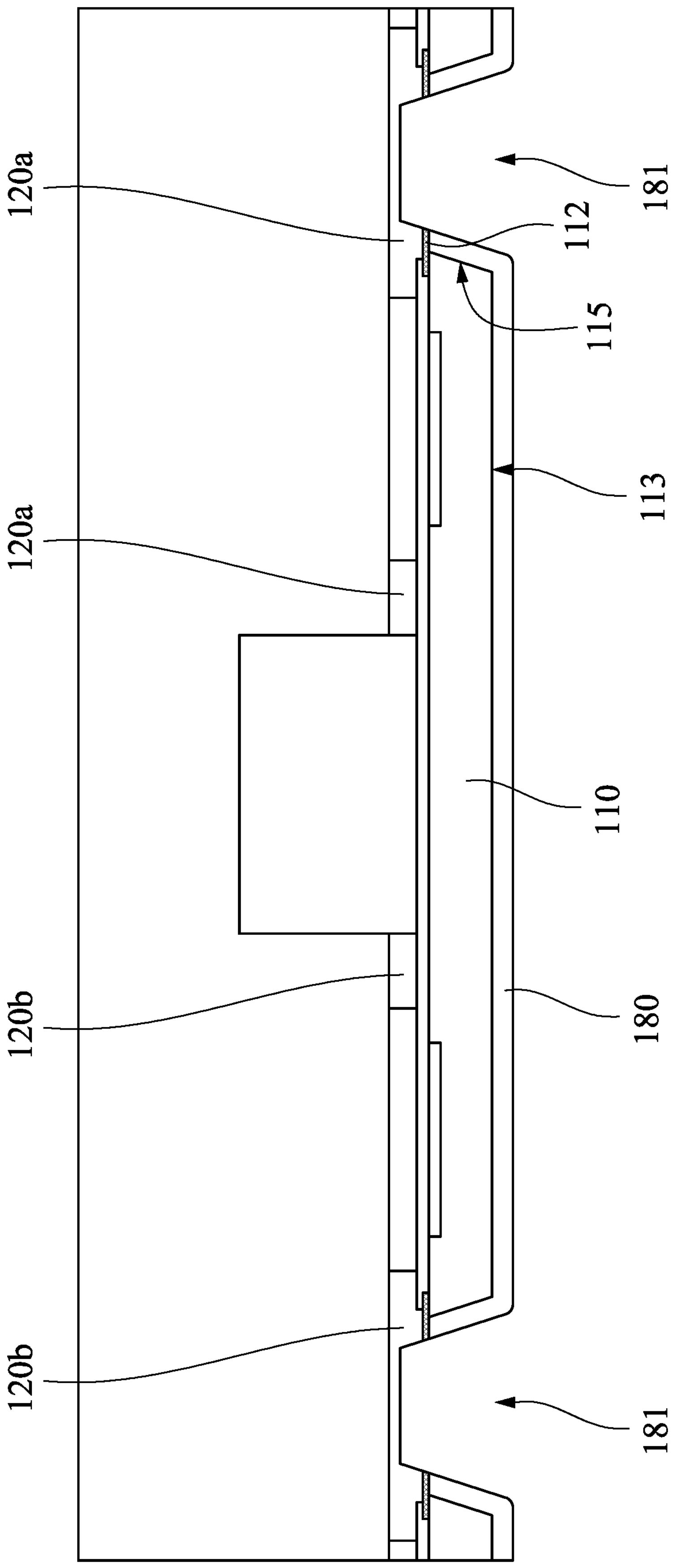

As shown in FIG. 5 and FIG. 6, after the formation of the recess 117 of the wafer 110, the isolation layer 180 may be formed along the inclined surface 115 and the bottom surface 113 of the wafer 110, and the isolation layer 180 is located in the recess 117. Thereafter, the isolation layer 180 in the recess 117 may be cut by cutting tool, thereby forming a recess 181. The outer sidewall of the conductive pad 112 is exposed through the recess 181. As a result, the structure of FIG. 6 can be obtained.

Figure 7:
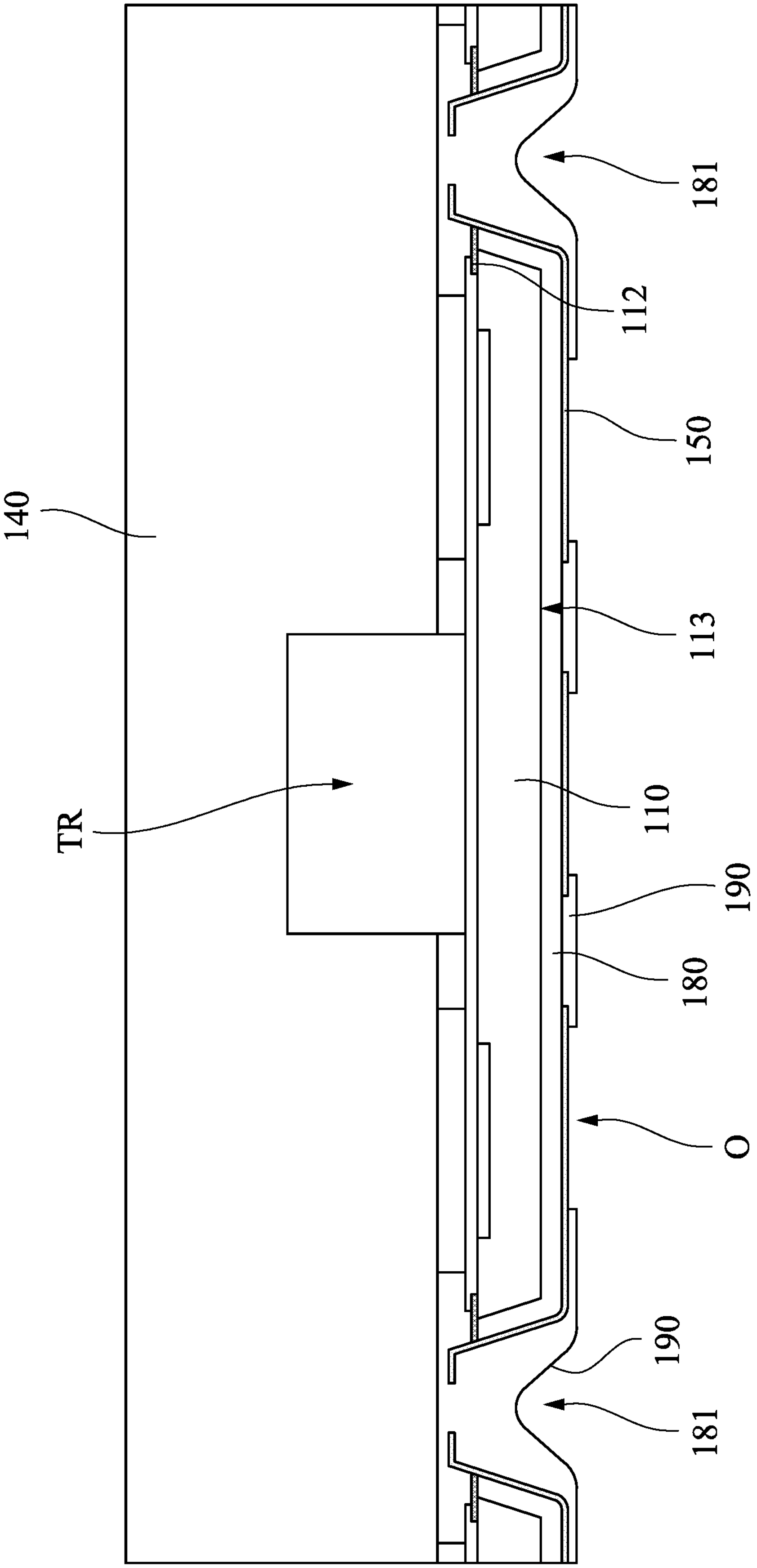

As shown in FIG. 7, after the formation of the recess 181 of the isolation layer 180, the redistribution layer 150 may be formed to electrically connect to the exposed conductive pad 112. The redistribution layer 150 extends to the isolation layer 180 that is on the bottom surface 113 of the wafer 110. Afterwards, the insulating layer 190 may be formed to cover the bottom surface of the redistribution layer 150 and the bottom surface of the isolation layer 180, and then the insulating layer 190 is patterned to form an opening O.

Figure 8:
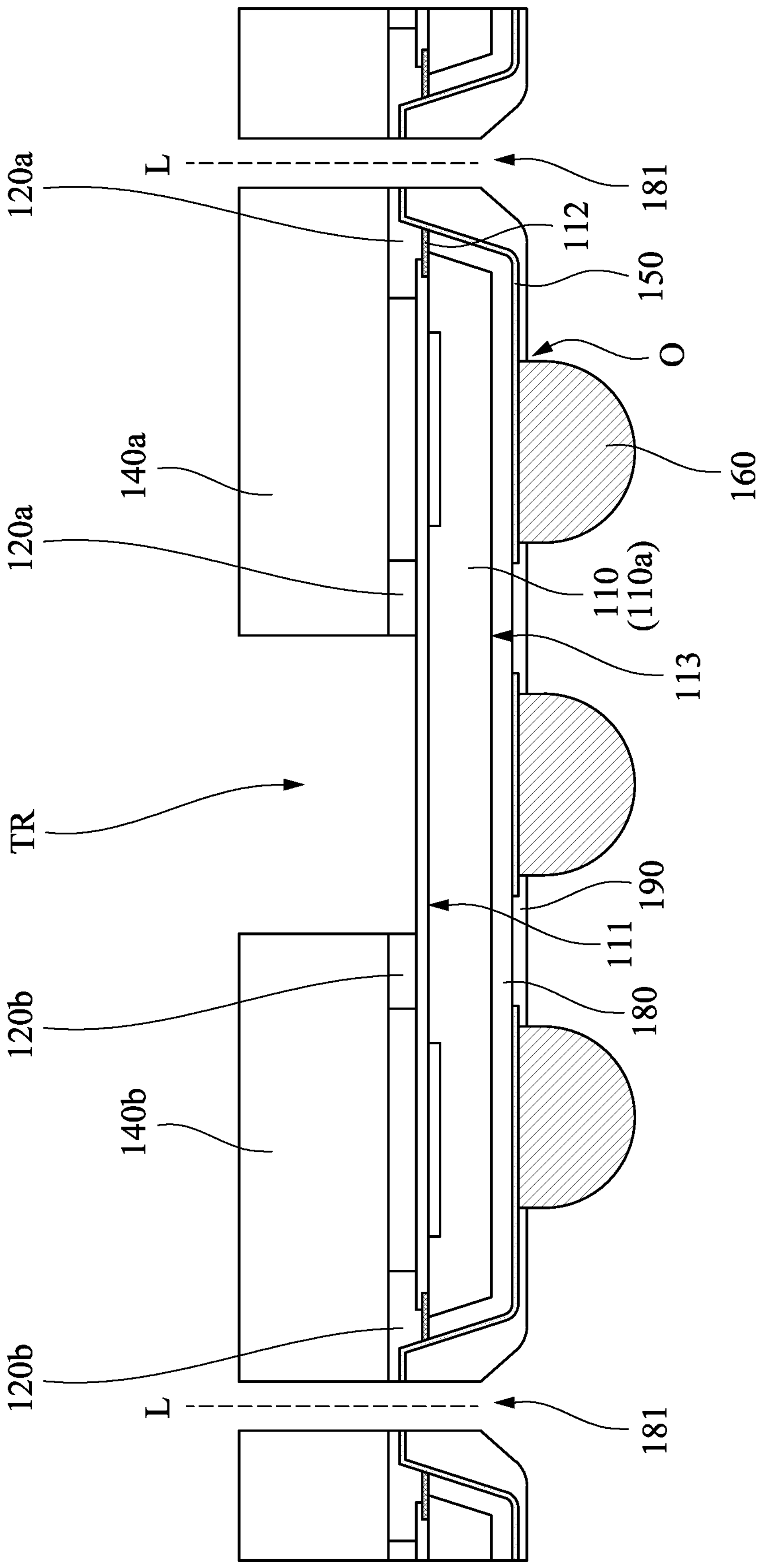

As shown in FIG. 7 and FIG. 8, after the formation of the opening O of the insulating layer 190, the conductive structure 160 may be formed in the opening O of the insulating layer 190, such that the conductive structure 160 is located on the redistribution layer 150 that is on the bottom surface 113 of the wafer 110, and the conductive structure 160 protrudes from the insulating layer 190. Thereafter, the top surface of the mother light transmissive sheet 140 may be ground to form the first light transmissive sheet 140*a* at one side (e.g., right side) of the trench TR and the second light transmissive sheet 140*b* at another side (e.g., left side) of the trench TR. After the formation of the first light transmissive sheet 140*a* and the second light transmissive sheet 140*b*, the first light transmissive sheet 140*a* and the underlying first support layer 120*a*, wafer 110, and insulating layer 190 are cut along the recess 181 (e.g., along line L), and the second light transmissive sheet 140*b* and the underlying second support layer 120*b*, wafer 110, and insulating layer 190 are also cut. As a result, the chip 110*a* can be formed after cutting the wafer 110.

As shown in FIG. 8 and FIG. 1, in the subsequent process, the light emitter 130 may be disposed on the top surface 111 of the chip 110*a*, and then the bonding wire W may be electrically connected to the chip 110*a*. Thereafter, the transparent glue 170 may be formed to cover the light emitter 130, thereby protecting the light emitter 130. Through the foregoing steps, the chip package 100 of FIG. 1 can be obtained.

Figure 9:
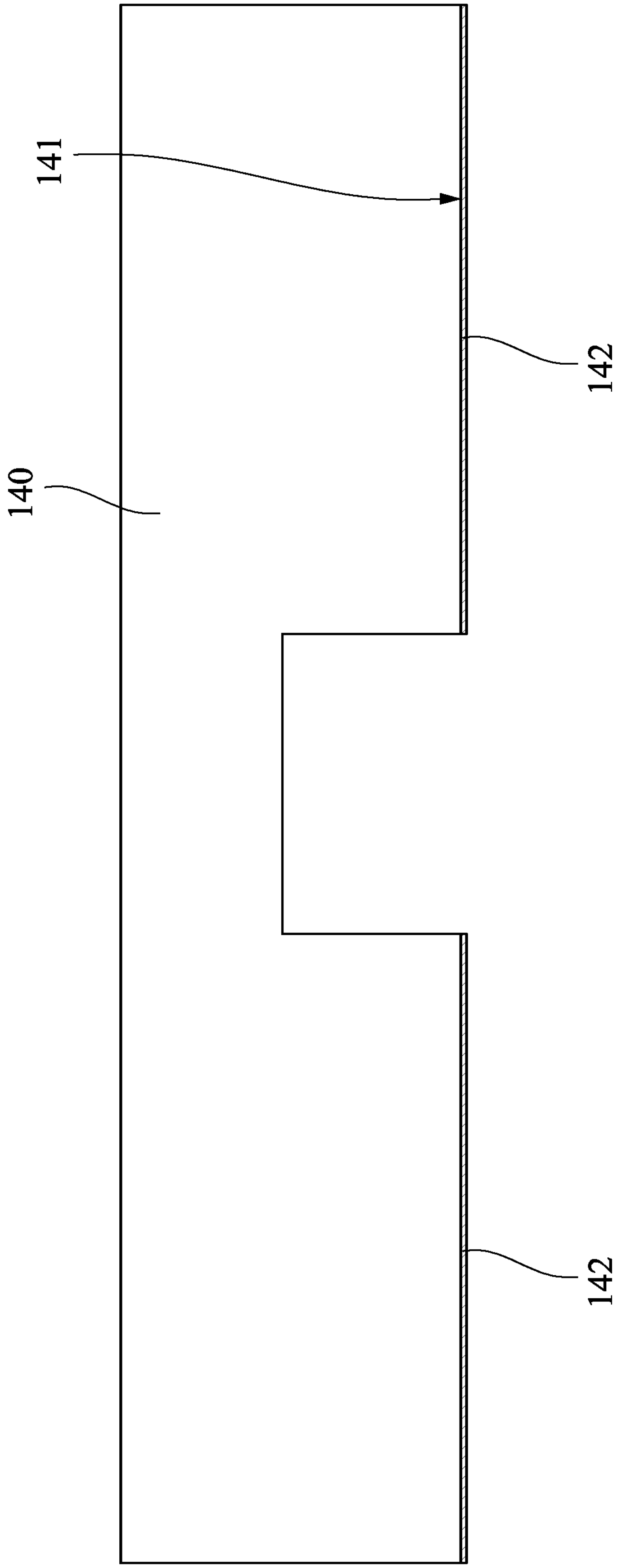
FIG. 9 is an alternative embodiment different from FIG. 2.
Figure 10:
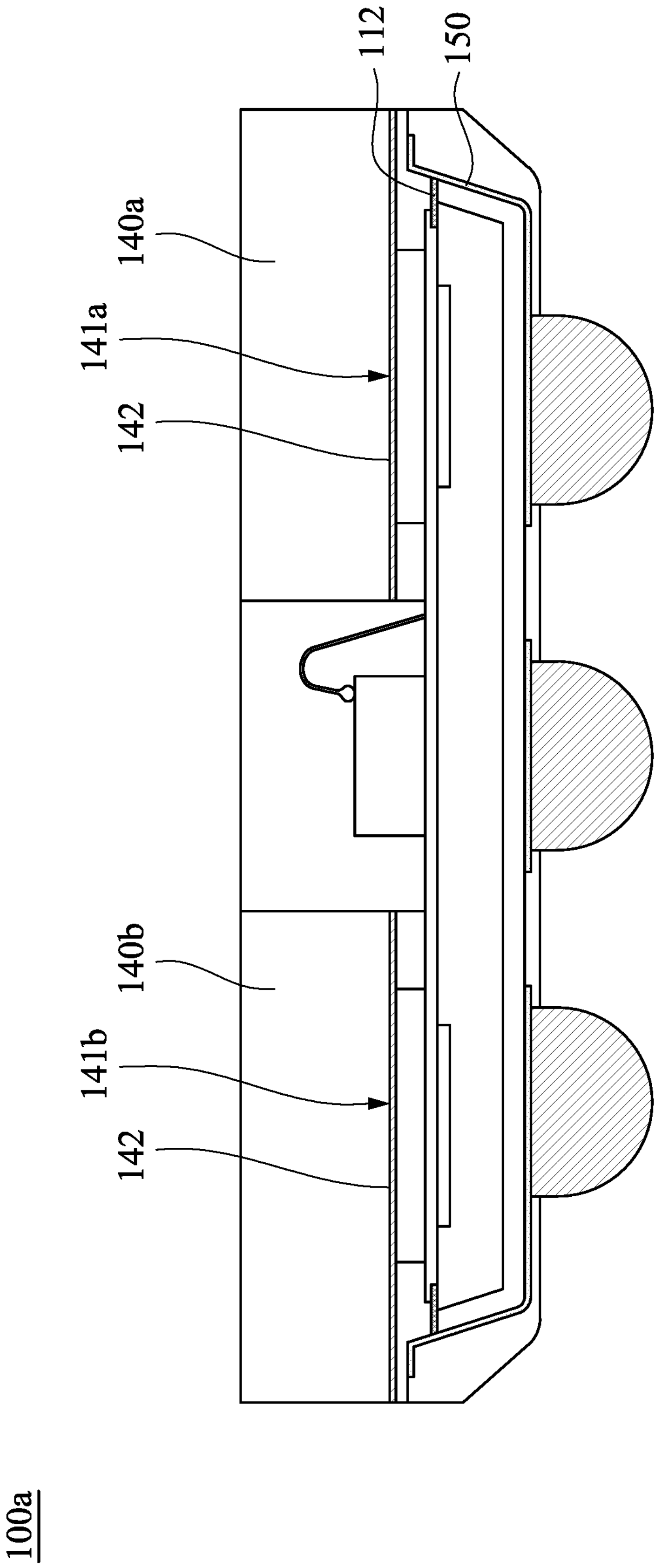
FIG. 10 is a cross-sectional view of a chip package according to another embodiment of the present disclosure.

FIG. 9 is an alternative embodiment different from FIG. 2. FIG. 10 is a cross-sectional view of a chip package 100*a* according to another embodiment of the present disclosure. As shown in FIG. 9 and FIG. 10, the difference between this embodiment and the aforementioned manufacturing method of the chip package 100 is that the manufacturing method of the chip package 100*a* further includes forming an anti-reflection layer 142 on a bottom surface 141 of the mother light transmissive sheet 140. As a result, after the steps from FIG. 3 to FIG. 8, the chip package 100*a* of FIG. 10 can be formed. The anti-reflection layer 142 of the chip package 100*a* is located on a bottom surface 141*a* of the first light transmissive sheet 140*a* and a bottom surface 141*b* of the second light transmissive sheet. 140*b*.

Figure 11:
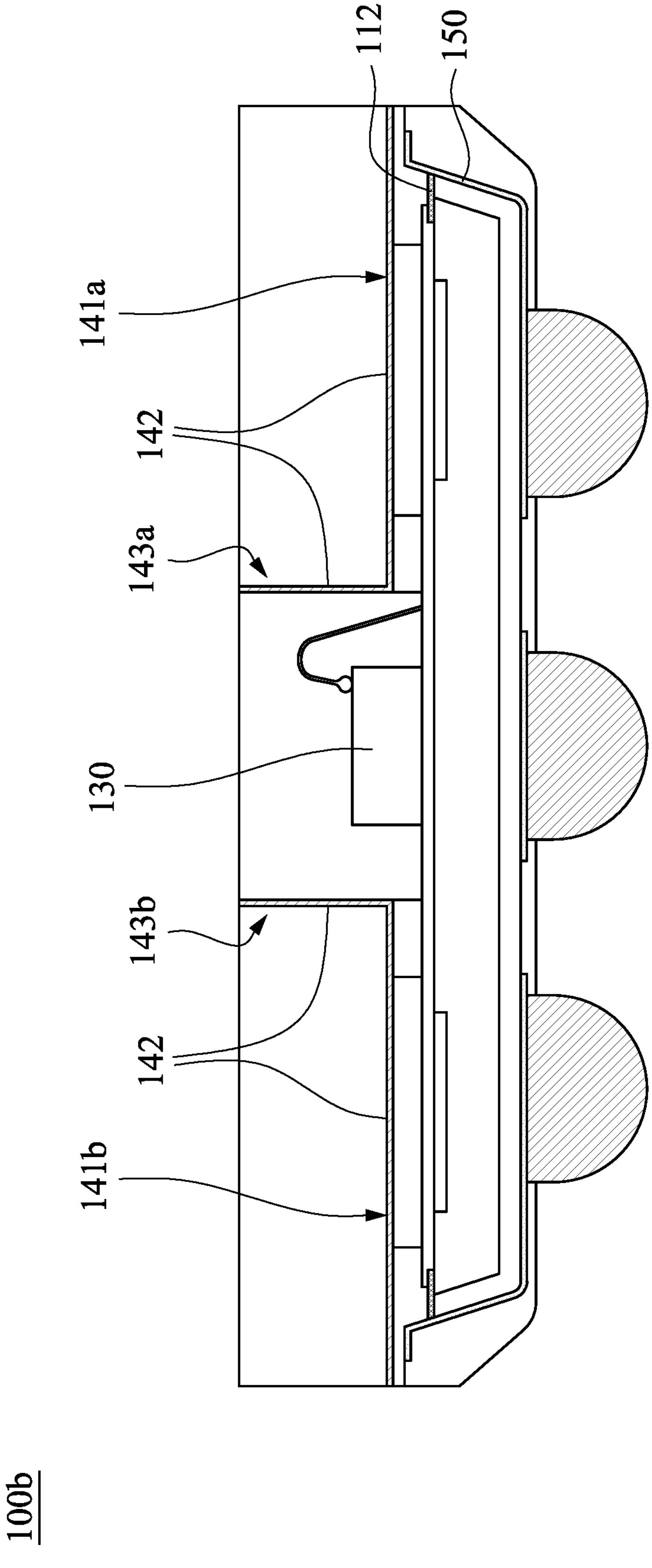
FIG. 11 is a cross-sectional view of a chip package according to still another embodiment of the present disclosure.

FIG. 11 is a cross-sectional view of a chip package 100*b* according to still another embodiment of the present disclosure. The difference between this embodiment and the embodiment of FIG. 10 is that the anti-reflection layer 142 of the chip package 100*b* extends to a sidewall 143*a* of the first light transmissive sheet 140*a* proximal to the light emitter 130, and extends to a sidewall 143*b* of the second light transmissive sheet 140*b* proximal to the light emitter 130. In this embodiment, when forming the anti-reflection layer 142 of FIG. 9, the anti-reflection layer 142 is further formed on the sidewall of the trench TR of the mother light transmissive sheet 140. As a result, after the steps from FIG. 3 to FIG. 8, the chip package 100*b* of FIG. 11 can be formed. In addition, in other embodiments, for the trench TR, a blind-hole type can be replaced with a through-hole type.

Figure 12:
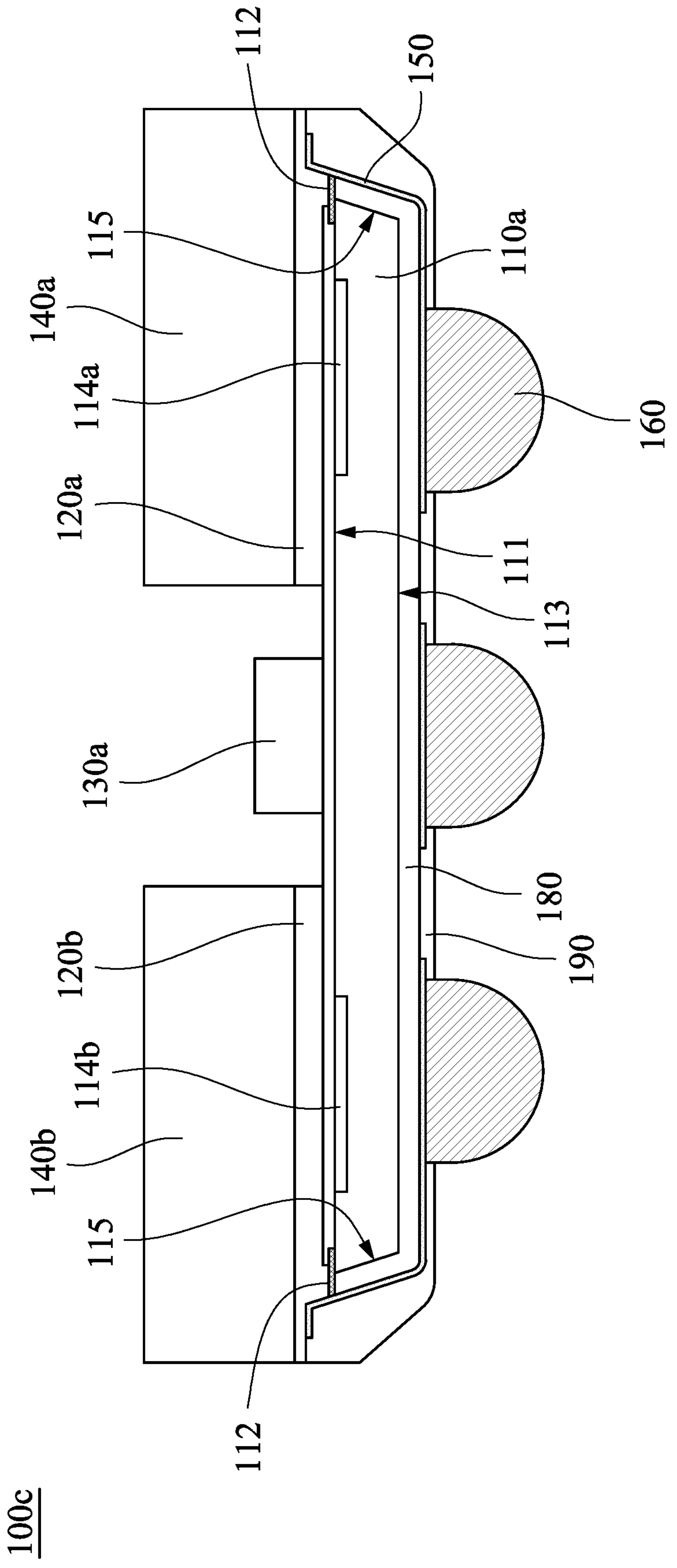
FIG. 12 is a cross-sectional view of a chip package according to yet another embodiment of the present disclosure.

FIG. 12 is a cross-sectional view of a chip package 100*c* according to yet another embodiment of the present disclosure. The chip package 100*c* includes the chip 110*a*, the first support layer 120*a*, a light emitter 130*a*, the first light transmissive sheet 140*a*, the second support layer 120*b*, the second light transmissive sheet 140*b*, the redistribution layer 150, and the conductive structure 160. The difference between this embodiment and the embodiment of FIG. 1 is that the first support layer 120*a* and the second support layer 120*b* of the chip package 100*c* are adhesives. The first support layer 120*a* covers the first light receiver 114*a* and overlaps the first light receiver 114*a* in a vertical direction. The second support layer 120*b* covers the second light receiver 114*b* and overlaps the second light receiver 114*b* in the vertical direction. In some embodiments, the light emitter 130*a* of the chip package 100*c* may be a surface mount device (SMD) without the bonding wire W of FIG. 1.

Figure 13:
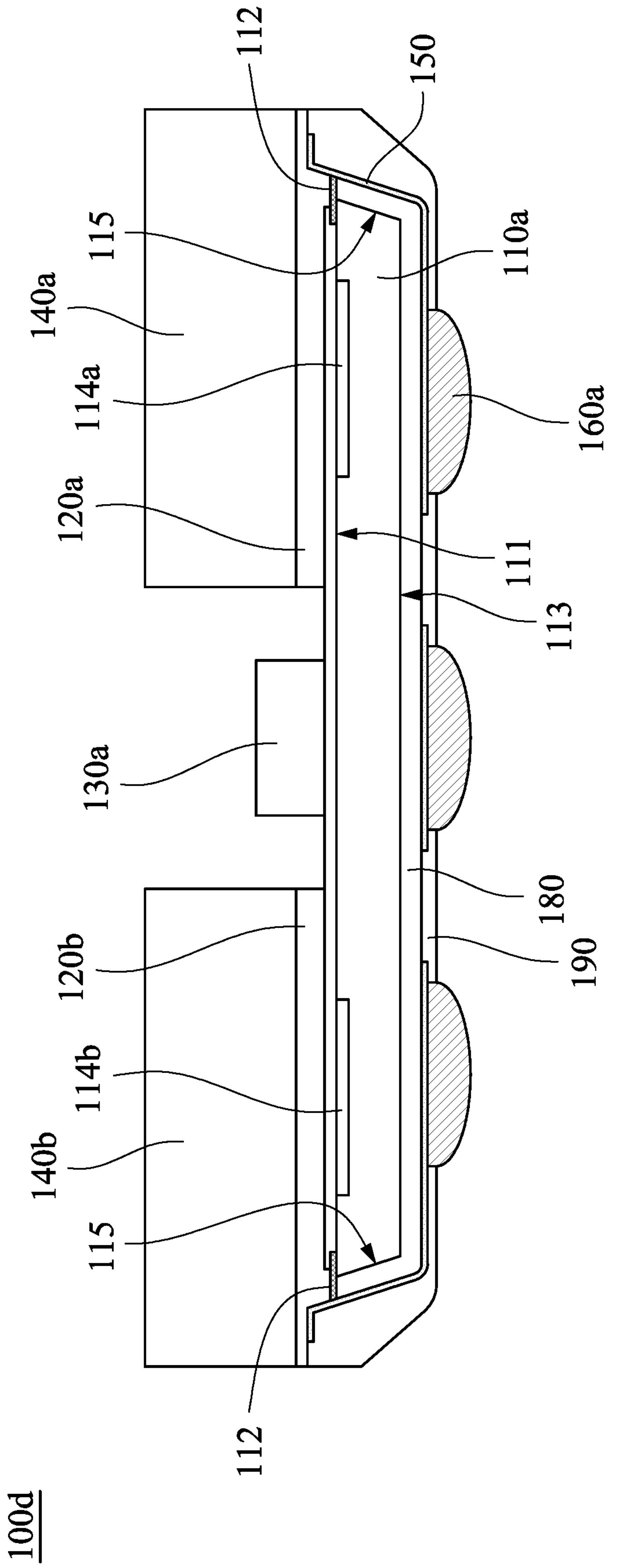
FIG. 13 is a cross-sectional view of a chip package according to one embodiment of the present disclosure.

FIG. 13 is a cross-sectional view of a chip package 100*d* according to one embodiment of the present disclosure. The chip package 100*d* includes the chip 110*a*, the first support layer 120*a*, the light emitter 130*a*, the first light transmissive sheet 140*a*, the second support layer 120*b*, the second light transmissive sheet 140*b*, the redistribution layer 150, and a conductive structure 160*a*. The difference between this embodiment and the embodiment of FIG. 12 is that the thickness of the conductive structure 160*a* of the chip package 100*d* is less than the thickness of the conductive structure 160 of the chip package 100*c*.

Figure 14:
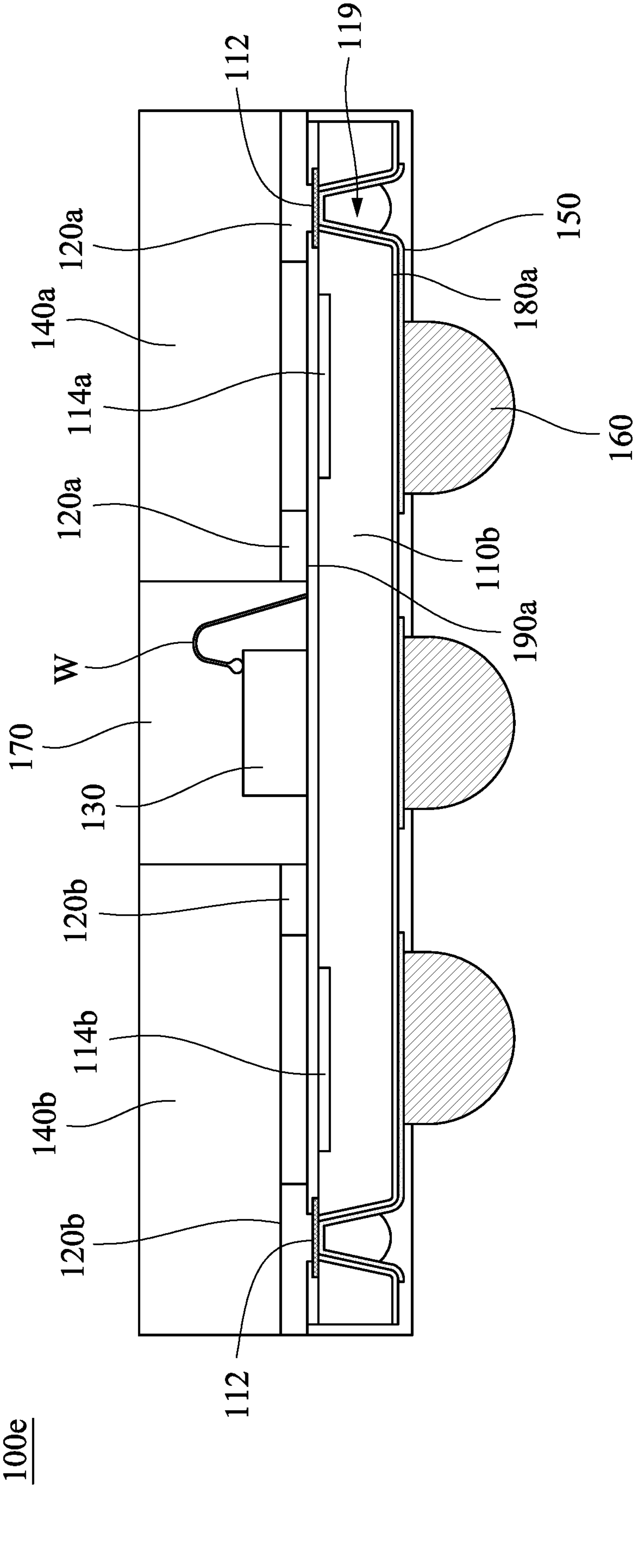
FIG. 14 is a cross-sectional view of a chip package according to another embodiment of the present disclosure.

FIG. 14 is a cross-sectional view of a chip package 100*e* according to another embodiment of the present disclosure. The chip package 100*e* includes a chip 110*b*, the first support layer 120*a*, the light emitter 130, the first light transmissive sheet 140*a*, the second support layer 120*b*, the second light transmissive sheet 140*b*, the redistribution layer 150, and the conductive structure 160. The difference between this embodiment and the embodiment of FIG. 1 is that the chip 110*b* of the chip package 100*e* has a through hole 119, and the conductive pad 112 is located in the through hole 119, the redistribution layer 150 extends into the through hole 119 to be in contact with the conductive pad 112. In this embodiment, the chip package 100*e* further includes an isolation layer 180*a* and an insulating layer 190*a*. The isolation layer 180*a* is located between the bottom surface 113 of the chip 110*b* and the redistribution layer 150 and between the sidewall of the through hole 119 and the redistribution layer 150. The insulating layer 190*a* is located on the bottom surface of the redistribution layer 150 and the bottom surface 113 of the chip 110*b*, and covers the opening of the through hole 119.

In alternative embodiments, the first support layer 120*a* and the second support layer 120*b* of the chip package 100*e* may be replaced with the adhesives of FIG. 12, such that the first support layer 120*a* covers the first light receiver 114*a* and overlaps the first light receiver 114*a* in the vertical direction, and the second support layer 120*b* covers the second light receiver 114*b* and overlaps the second light receiver 114*b* in the vertical direction. In some embodiments, the conductive structure 160 of the chip package 100*e* may be replaced with the conductive structure 160*a* of FIG. 13 having a smaller thickness based on design requirements.

Figure 15:
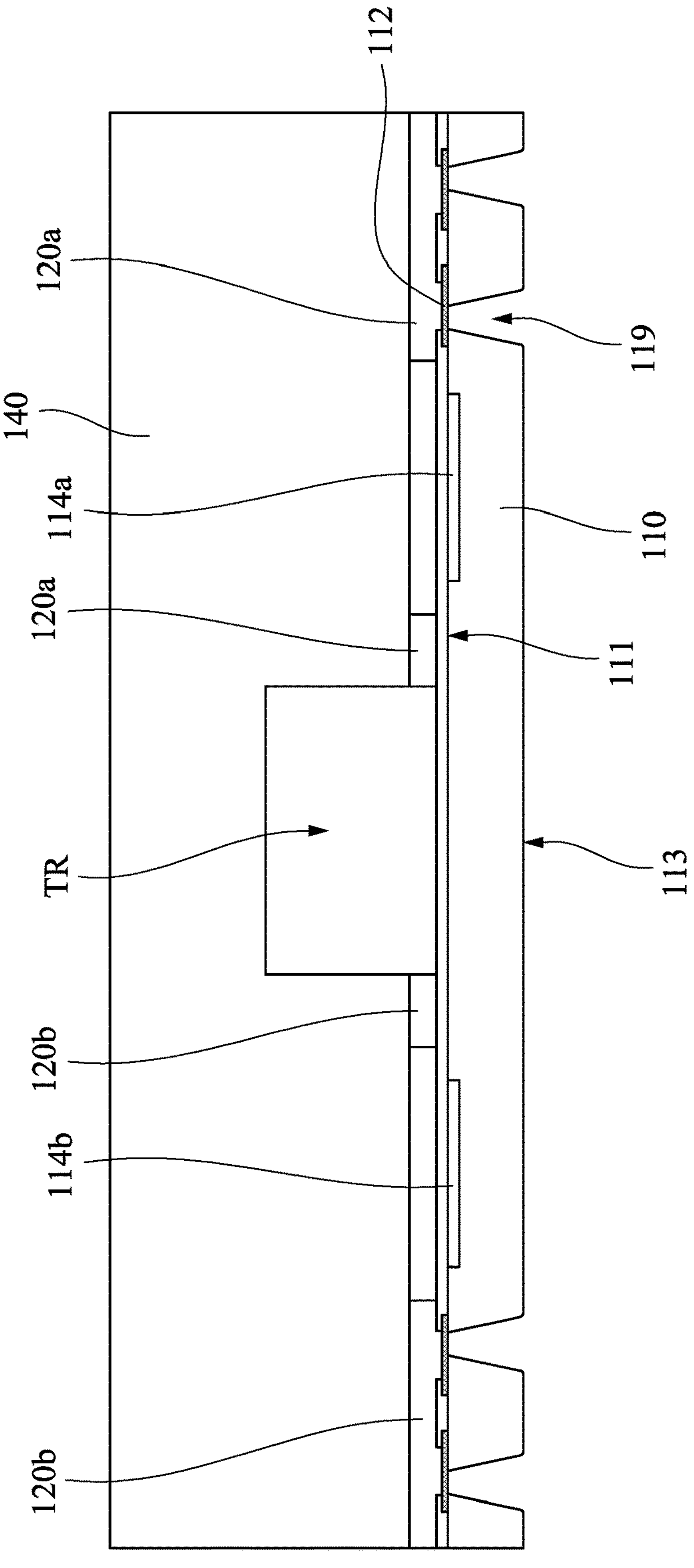
FIGS. 15 to 19 are cross-sectional views at intermediate stages of a manufacturing method of the chip package of FIG. 14.
Figure 16:
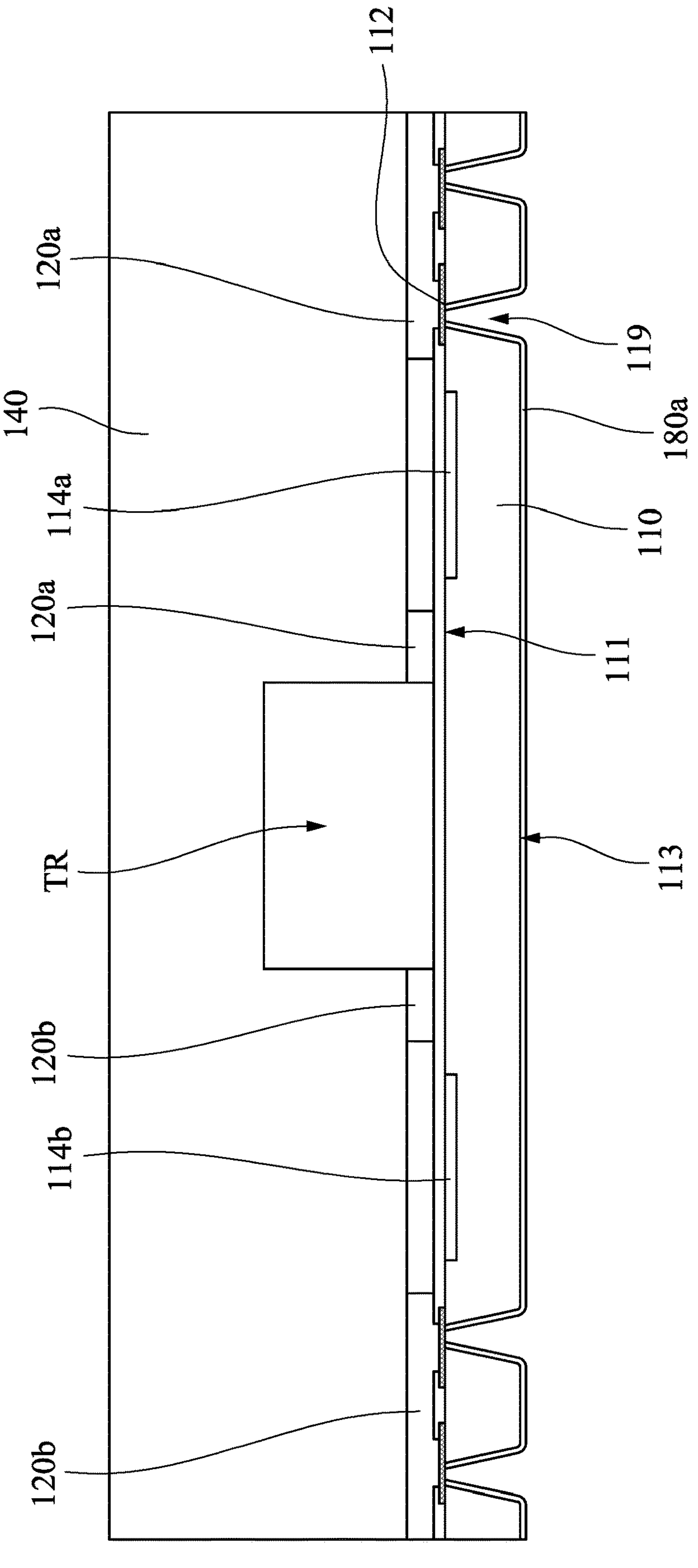

FIGS. 15 to 19 are cross-sectional views at intermediate stages of a manufacturing method of the chip package 100*e* of FIG. 14. The steps of the manufacturing method of the chip package 100*e* before FIG. 15 are the same as the steps of FIGS. 2 and 3, and will not be repeated in the following description. As shown in FIG. 15 and FIG. 16, after the mother light transmissive sheet 140 is bonded to the wafer 110, the bottom surface 113 of the wafer 110 may be ground to thin the wafer 110, and then the bottom surface 113 of the wafer 110 may be etched to form the through hole 119 that exposes the conductive pad 112. The through hole 119 penetrates through the top surface 111 and the bottom surface 113 of the wafer 110. Thereafter, the isolation layer 180*a* may be formed on the bottom surface 113 of the wafer 110, the sidewall of the through hole 119, and the conductive pad 112 that is in the through hole 119. The isolation layer 180*a* on the conductive pad 112 can be removed by a patterning process, thereby forming the structure of FIG. 16.

Figure 17:
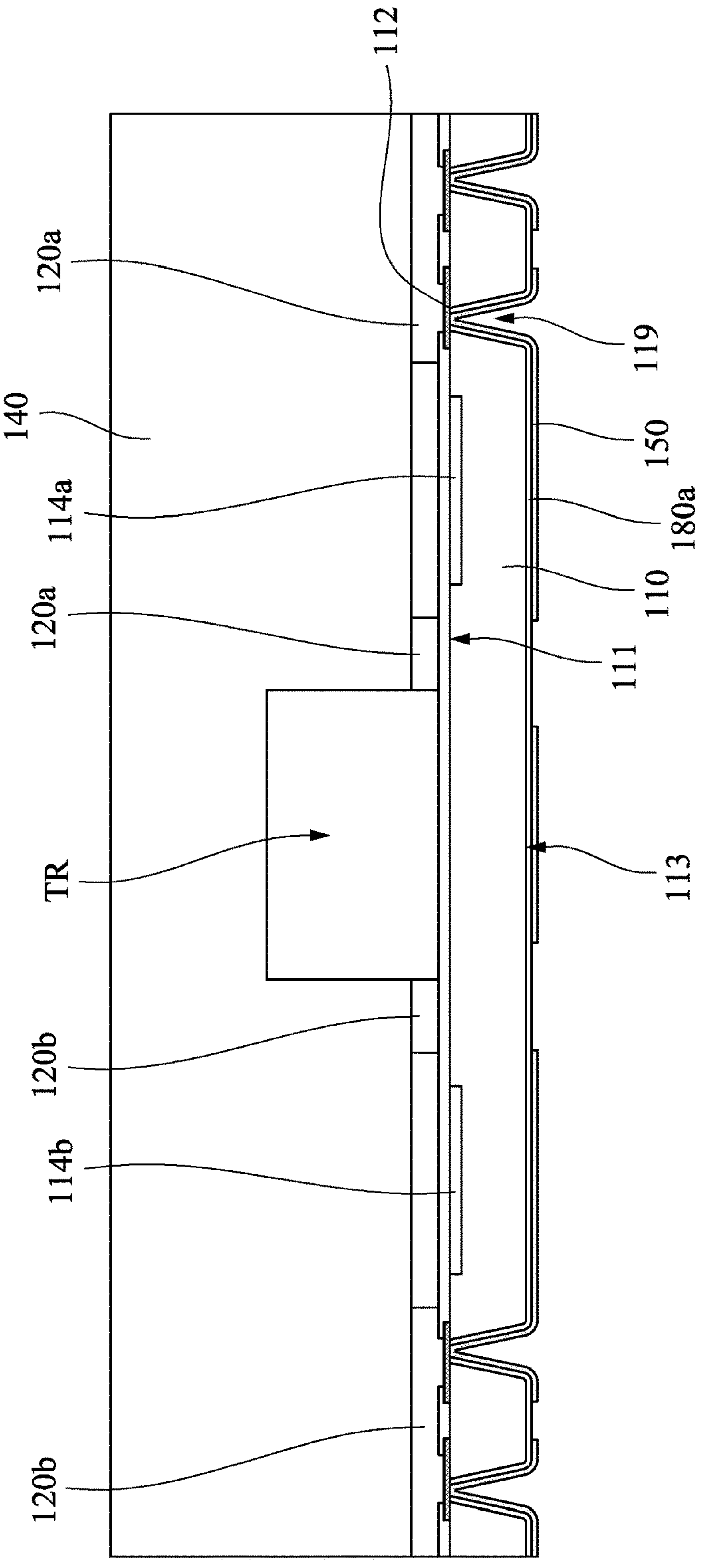

Referring to FIG. 17, afterwards, the redistribution layer 150 may be formed on the isolation layer 180*a*, and the redistribution layer 150 extends into the through hole 119 to be in contact with the conductive pad 112, such that the isolation layer 180*a* is located between the bottom surface 113 of the wafer 110 and the redistribution layer 150 and between the sidewall of the through hole 119 and the redistribution layer 150.

Figure 18:
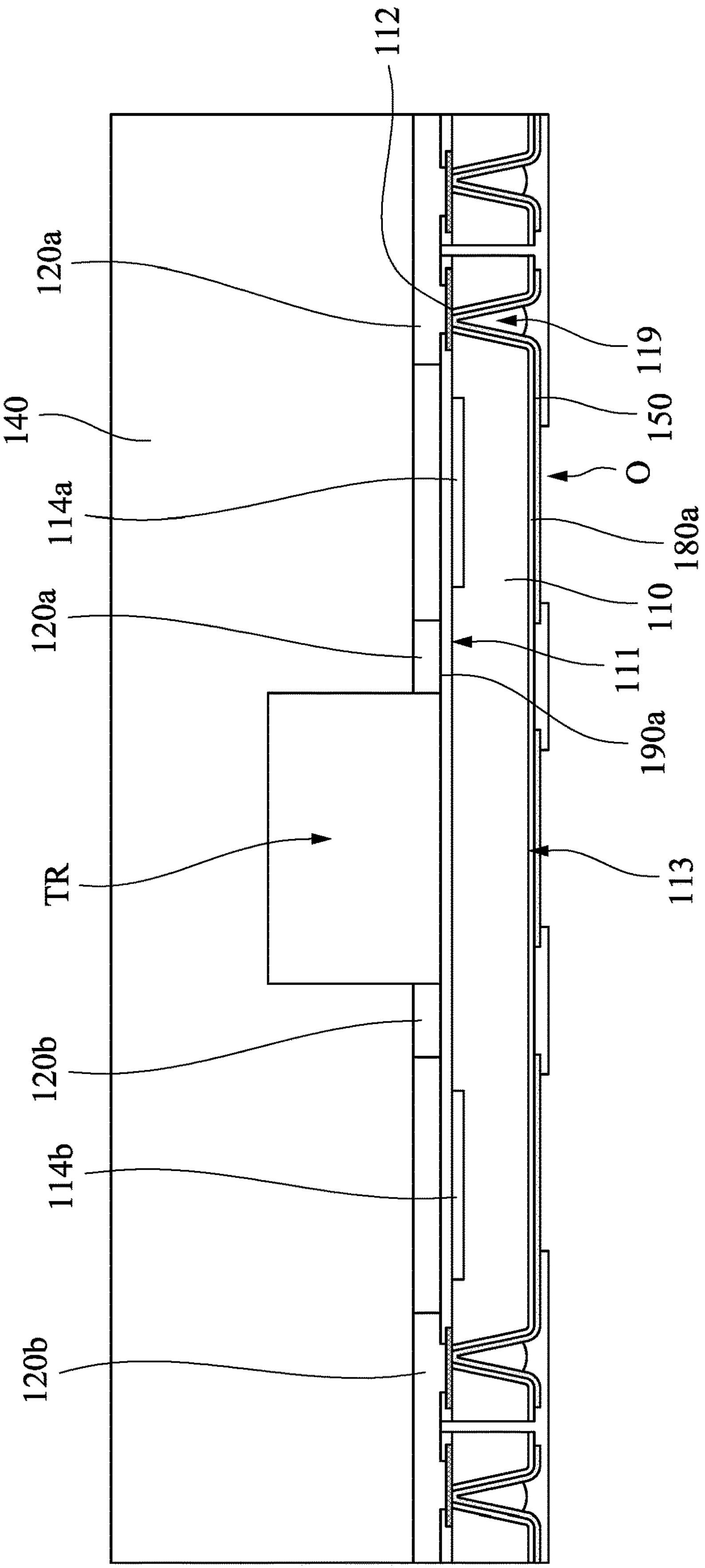

Referring to FIG. 18, thereafter, the insulating layer 190*a* may be formed on the bottom surface of the redistribution layer 150 and the bottom surface of the isolation layer 180*a*, and the insulating layer 190*a* covers the opening of the through hole 119. Next, the insulating layer 190*a* may be patterned to form the opening O. In some embodiments, prior to forming the insulating layer 190*a*, the wafer 110 between two adjacent conductive pads 112 may be cut, such that the insulating layer 190*a* may extend to the first support layer 120*a* and the second support layer 120*b* after the formation of the insulating layer 190*a*.

Figure 19:
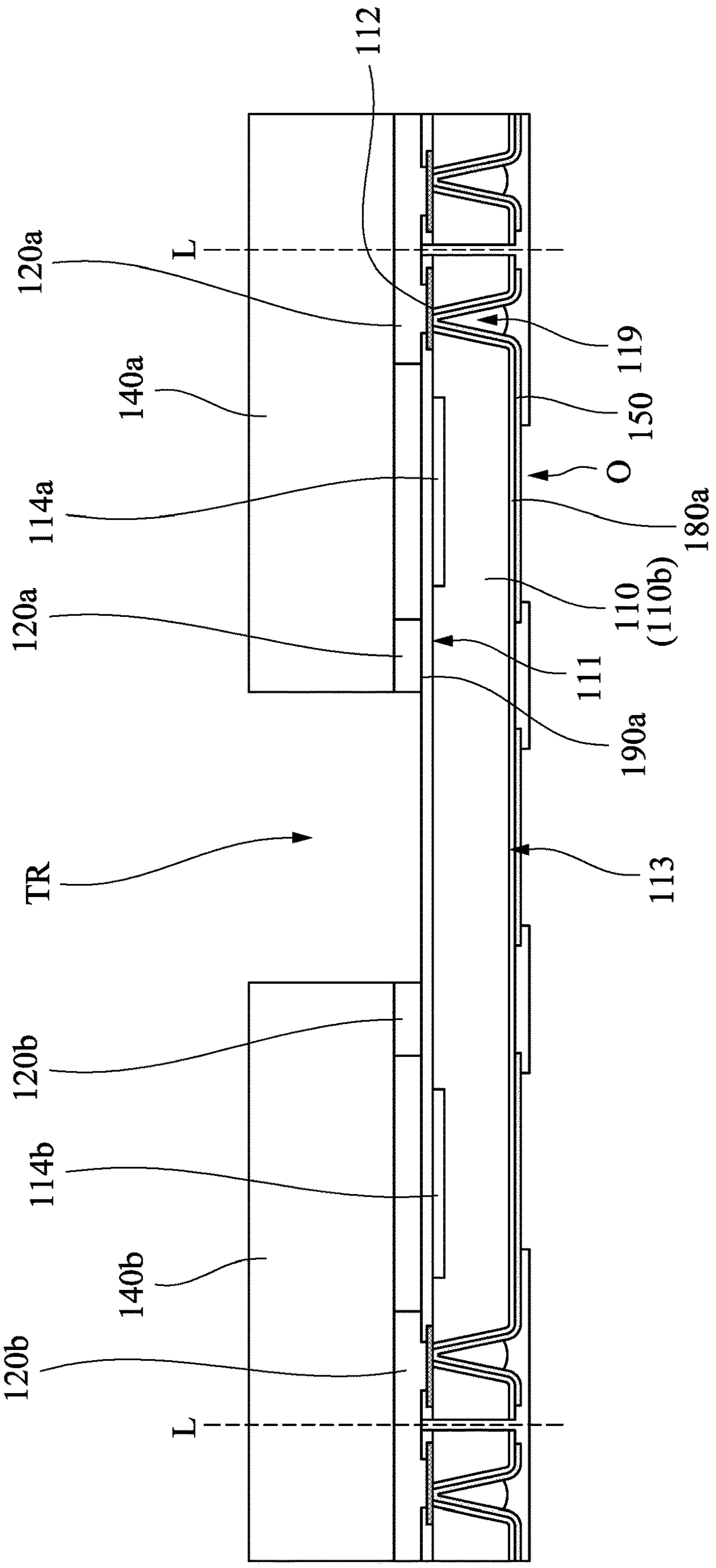

As shown in FIG. 18 and FIG. 19, after the formation of the opening O of the insulating layer 190*a*, the conductive structure 160 may be formed in the opening O of the insulating layer 190*a*, such that the conductive structure 160 is located on the redistribution layer 150 that is on the bottom surface 113 of the wafer 110, and the conductive structure 160 protrudes from the insulating layer 190*a*. Thereafter, the top surface of the mother light transmissive sheet 140 may be ground to form the first light transmissive sheet 140*a* at one side (e.g., right side) of the trench TR and the second light transmissive sheet 140*b* at another side (e.g., left side) of the trench TR. After the formation of the first light transmissive sheet 140*a* and the second light transmissive sheet 140*b*, the first light transmissive sheet 140*a* and the underlying first support layer 120*a*, wafer 110, and insulating layer 190 are cut along line L, and the second light transmissive sheet 140*b* and the underlying second support layer 120*b*, wafer 110, and insulating layer 190 are also cut. As a result, the chip 110*b* can be formed after cutting the wafer 110.

As shown in FIG. 19 and FIG. 14, in the subsequent process, the light emitter 130 may be disposed on the top surface 111 of the chip 110*b*, and then the bonding wire W may be electrically connected to the chip 110*b*. Thereafter, the transparent glue 170 may be formed to cover the light emitter 130, thereby protecting the light emitter 130. Through the foregoing steps, the chip package 100*e* of FIG. 14 can be obtained.

Figure 20:
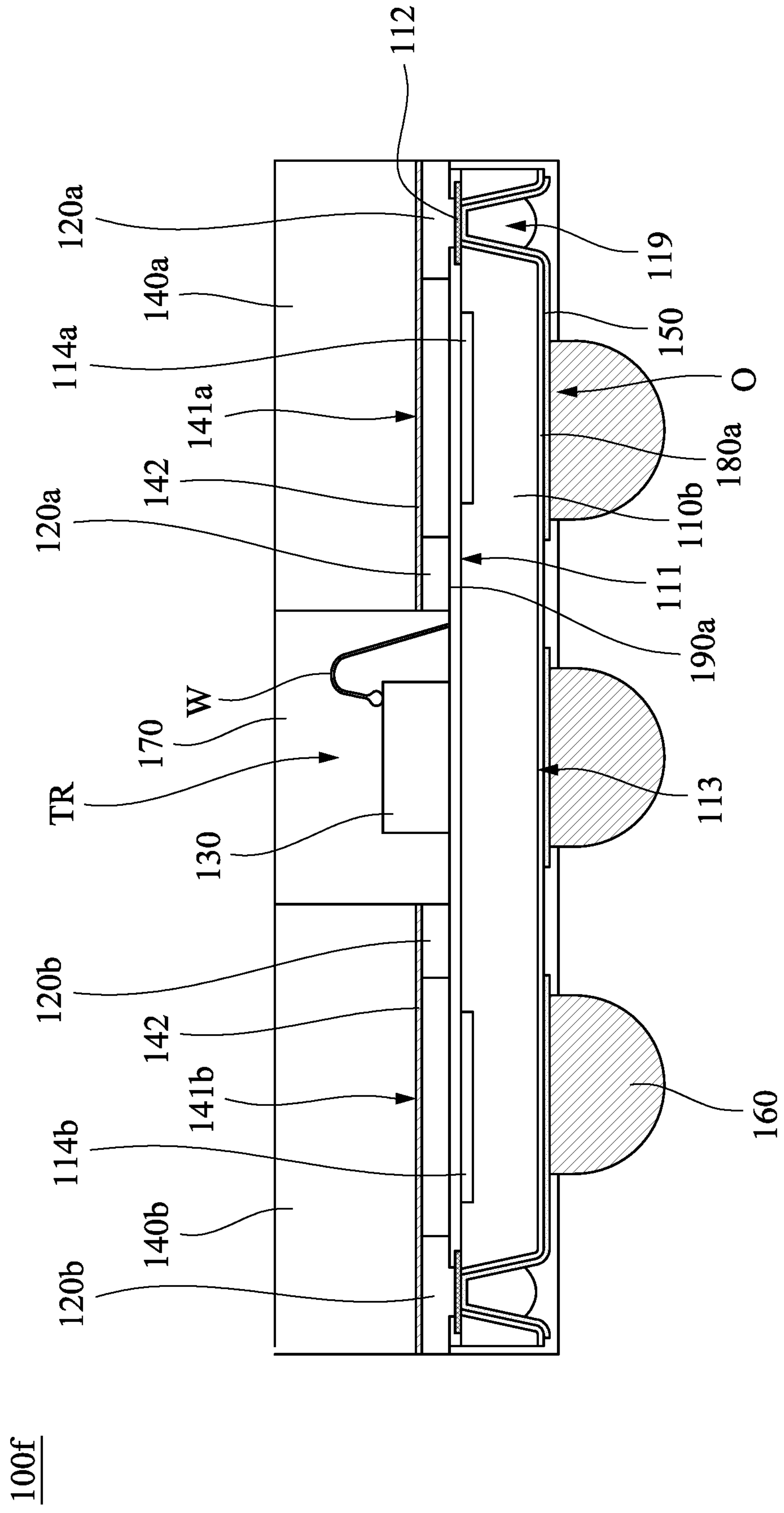
FIG. 20 is a cross-sectional view of a chip package according to still another embodiment of the present disclosure.

FIG. 20 is a cross-sectional view of a chip package 100*f* according to still another embodiment of the present disclosure. As shown in FIGS. 9 and 20, the difference between this embodiment and the manufacturing method of the chip package 100*e* is that the manufacturing method of the chip package 100*f* further includes forming the anti-reflection layer 142 on the bottom surface 141 of the mother light transmissive sheet 140. As a result, after the steps from FIG. 15 to FIG. 19, the chip package 100*f* of FIG. 20 can be formed. The anti-reflection layer 142 of the chip package 100*f* is located on the bottom surface 141*a* of the first light transmissive sheet 140*a* and the bottom surface 141*b* of the second light transmissive sheet. 140*b*.

In addition, in other embodiments, the chip package 100*f* may have the anti-reflection layer 142 of FIG. 11 extending to the sidewall 143*a* of the first light transmissive sheet 140*a* and the anti-reflection layer 142 of FIG. 11 extending to the sidewall 143*b* of the second light transmissive sheet 140*b*.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:

a chip, wherein a top surface of the chip has a conductive pad and a first light receiver;

a first support layer located on the top surface of the chip;

a light emitter located on the top surface of the chip;

a first light transmissive sheet located on a top surface of the first support layer and covering the first light receiver, wherein a top surface of the light emitter is higher than the top surface of the first support layer and a bottom surface of the first light transmissive sheet;

a transparent glue covering the light emitter, wherein an entire top surface of the transparent glue is coplanar with a top surface of the first light transmissive sheet;

a redistribution layer electrically connected to the conductive pad and extending to a bottom surface of the chip; and a conductive structure located on the redistribution layer that is on the bottom surface of the chip.

2. The chip package of claim 1, wherein a material of the first support layer comprises epoxy, and the first support layer surrounds the first light receiver.

3. The chip package of claim 1, wherein the first support layer is an adhesive, and the first support layer overlaps the first light receiver in a vertical direction.

4. The chip package of claim 1, further comprising:

an anti-reflection layer located on the bottom surface of the first light transmissive sheet.

5. The chip package of claim 4, wherein the anti-reflection layer extends to a sidewall of the first light transmissive sheet proximal to the light emitter.

6. The chip package of claim 1, wherein the top surface of the chip further has a second light receiver, and the light emitter is located between the first light receiver and the second light receiver.

7. The chip package of claim 6, further comprising:

a second support layer located on the top surface of the chip; and a second light transmissive sheet located on the second support layer and covering the second light receiver.

8. The chip package of claim 7, further comprising:

an anti-reflection layer located on a bottom surface of the second light transmissive sheet.

9. The chip package of claim 8, wherein the anti-reflection layer extends to a sidewall of the second light transmissive sheet proximal to the light emitter.

10. The chip package of claim 7, wherein a material of the second support layer comprises epoxy, and the second support layer surrounds the second light receiver.

11. The chip package of claim 7, wherein the second support layer is an adhesive, and the second support layer overlaps the second light receiver in a vertical direction.

12. The chip package of claim 1, wherein the transparent glue is disposed on the top surface of the light emitter.

13. The chip package of claim 1, wherein the chip has an inclined surface adjoining the top surface and the bottom surface of the chip, the conductive pad protrudes from the inclined surface, and an outer sidewall of the conductive pad is in contact with the redistribution layer.

14. The chip package of claim 13, further comprising:

an isolation layer disposed along the inclined surface and the bottom surface of the chip, and located between the chip and the redistribution layer; and an insulating layer covering a bottom surface of the redistribution layer and a bottom surface of the isolation layer, wherein the conductive structure protrudes from the insulating layer.

15. The chip package of claim 1, wherein the chip has a through hole, the conductive pad is located in the through hole, and the redistribution layer extends into the through hole to be in contact with the conductive pad, and the chip package further comprises:

an isolation layer located between the bottom surface of the chip and the redistribution layer and between a sidewall of the through hole and the redistribution layer.

16. The chip package of claim 15, further comprising:

an insulating layer located on a bottom surface of the redistribution layer and the bottom surface of the chip, and covering an opening of the through hole, wherein the conductive structure protrudes from the insulating layer.

17. A manufacturing method of a chip package, comprising:

bonding a mother light transmissive sheet to a first support layer on a top surface of a wafer, wherein the top surface of the wafer has a conductive pad and a first light receiver, the mother light transmissive sheet covers the first light receiver and has a trench;

etching a bottom surface of the wafer to form a recess or a through hole that exposes the conductive pad;

forming a redistribution layer electrically connected to the conductive pad and extending to the bottom surface of the wafer;

forming a conductive structure on the redistribution layer on the bottom surface of the wafer;

grinding a top surface of the mother light transmissive sheet to form a first light transmissive sheet at one side of the trench, wherein the first light transmissive sheet is located on a top surface of the first support layer;

cutting the first light transmissive sheet, the first support layer, and the wafer such that the wafer forms a chip;

disposing a light emitter on a top surface of the chip, wherein a top surface of the light emitter is higher than the top surface of the first support layer and a bottom surface of the first light transmissive sheet; and disposing a transparent glue to cover the light emitter, wherein an entire top surface of the transparent glue is coplanar with a top surface of the first light transmissive sheet.

18. The manufacturing method of the chip package of claim 17, wherein the top surface of the wafer further has a second light receiver, bonding the mother light transmissive sheet to the first support layer on the top surface of the wafer is performed such that the mother light transmissive sheet is simultaneously bonded to a second support layer on the top surface of the wafer, and the mother light transmissive sheet covers the second support layer.

19. The manufacturing method of the chip package of claim 17, further comprising:

forming an anti-reflection layer on a bottom surface of the mother light transmissive sheet.

20. The manufacturing method of the chip package of claim 19, further comprising:

forming the anti-reflection layer on a sidewall of the trench of the mother light transmissive sheet.

* * * * *